United States Patent [19]

Oguchi

[11] E Patent Number: Re. 32,853

[45] Reissued Date of Patent: Jan. 31, 1989

[54] TUNING DEVICE

[75] Inventor: Toshiaki Oguchi, Tokorozawa, Japan

[73] Assignee: Citizen Watch Co., Ltd., Tokyo, Japan

[21] Appl. No.: 89,440

[22] Filed: Aug. 26, 1987

Related U.S. Patent Documents

Reissue of:

[64] Patent No.: 4,609,894
Issued: Sep. 2, 1986
Appl. No.: 653,846
Filed: Sep. 24, 1984

[30] Foreign Application Priority Data

Sep. 29, 1983 [JP] Japan ..... 58-182558

[51] Int. Cl.[4] ..... H03J 1/08

[52] U.S. Cl. ..... 334/11; 74/10.8; 74/421 R; 116/252; 334/89

[58] Field of Search ..... 334/11, 50, 51, 86, 334/89; 116/249, 289, 299, 241, 309, 252, 253; 74/10.8, 421 R

[56] References Cited

U.S. PATENT DOCUMENTS

| | | | |
|---|---|---|---|
| 1,938,061 | 12/1933 | Brower | 116/252 |
| 2,567,585 | 9/1951 | Wagenknecht et al. | 74/10.8 |
| 3,254,540 | 6/1966 | Thurnell | 74/10.8 |

*Primary Examiner*—Paul Gensler
*Attorney, Agent, or Firm*—Birch, Stewart, Kolasch & Birch

[57] ABSTRACT

A tuning device has a dial drum rotatably supported in a frame, and a rheostat operatively connected to the dial drum. A knob is disposed in alignment with the dial drum. The dial drum has an outer toothing formed on the periphery thereof. A drive gear is secured to the knob, and a reduction gear train is disposed between the drive gear and the outer toothing for transmitting the rotation of the drive gear to the dial drum.

3 Claims, 2 Drawing Sheets

PRIOR ART
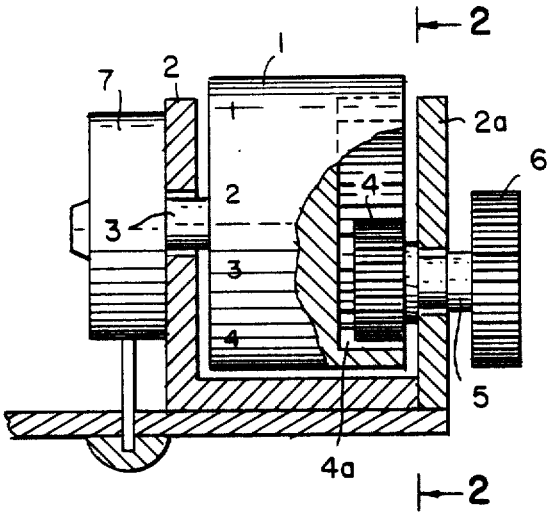
FIG. 1
FIG. 2
PRIOR ART
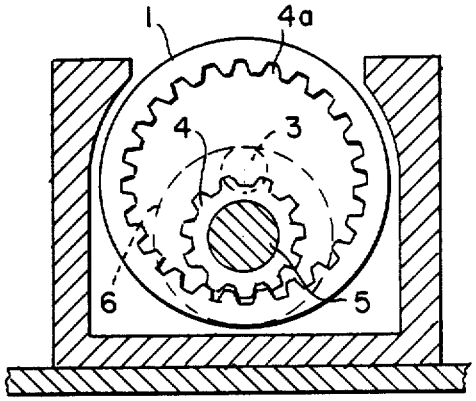
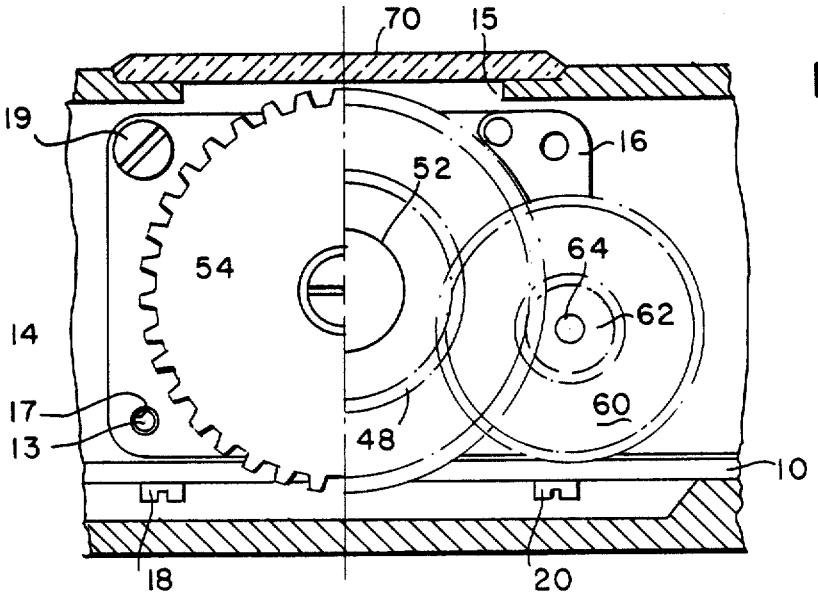
FIG. 5

TUNING DEVICE

Matter enclosed in heavy brackets [ ] appears in the original patent but forms no part of this reissue specification; matter printed in italics indicates the additions made by reissue.

BACKGROUND OF THE INVENTION

The present invention relates to a tuning device for a television or radio receiver.

FIGS. 1 and 2 depict a conventional tuning device for a television receiver. The tuning device has a dial drum 1 rotatably mounted in a frame 2 by a shaft 3. The dial drum 1 has an internal toothing 4a with which a drive pinion 4 is engaged. The drive pinion 4 is rotatably mounted in a frame 2a by a shaft 5 having a knob 6. The shaft 3 of the drum 1 is operatively connected in sliding contact with a rheostat 7 provided on the outside of the frame 2. Thus, rotation of the knob 6 causes the dial drum 1 to rotate through the drive pinion 4.

In such a device, the diameter of the drive pinion 4 cannot be reduced below a limit value. Accordingly, in order to increase the gear reduction ratio for fine tuning, the diameter of the display drum must be increased, which in turn causes an increase in the size of the tuning device. Furthermore, the shaft 5 of the knob 6 is eccentric with reference to the center of the dial drum 1. This construction gives the user the impression that the knob and dial drum form a disconnected structure.

SUMMARY OF THE INVENTION

The object of the present invention is to provide a tuning device in which a shaft of a knob and a shaft of a dial drum are in alignment with each other and which may be made to have a large gear reduction ratio for fine tuning without increasing the size of the device.

According to the present invention, there is provided a tuning device comprising a dial drum rotatably supported in a frame, a rheostat operatively connected to the dial drum, and a knob disposed in alignment with the dial drum. The dial drum bears figures for tuning and has an outer toothing formed on the periphery thereof. A drive gear is secured to the knob, and a gear reduction train is disposed between the drive gear and the outer toothing for transmitting the rotation of the drive gear to the dial drum.

In another aspect of the present invention, the drive gear is rotatably supported in the dial drum and a supporting plate. The gear reduction train comprises a large diameter gear engaged with the drive gear and a small diameter gear engaged with the outer toothing and integral with the large diameter gear.

These and other objects and features of the present invention will become more apparent from the following description taken with reference to the accompanying drawings.

BRIEF DESCRIPTION OF THE DRAWINGS

FIG. 1 is a sectional side view of a conventional tuning device.

FIG. 2 is a sectional view taken along line 2—2 of FIG. 1;

FIG. 5 is a sectional view taken along line 5—5 of FIG. 3.

DESCRIPTION OF THE PREFERRED EMBODIMENTS

Figure 3:
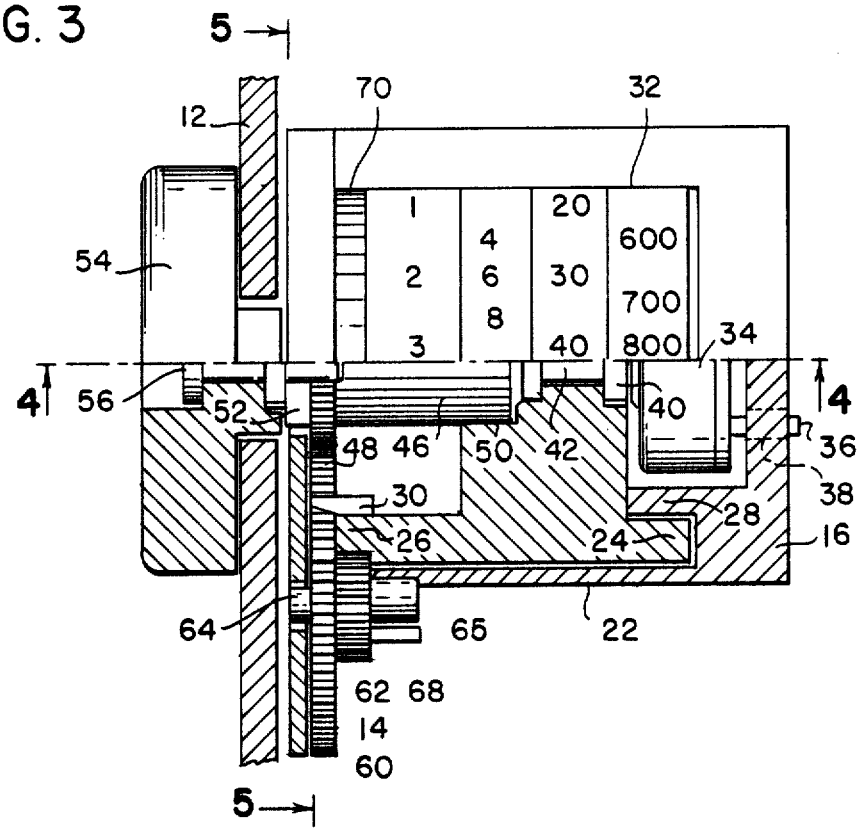
FIG. 3 is a plan view, a part of which is broken away.
Figure 4:
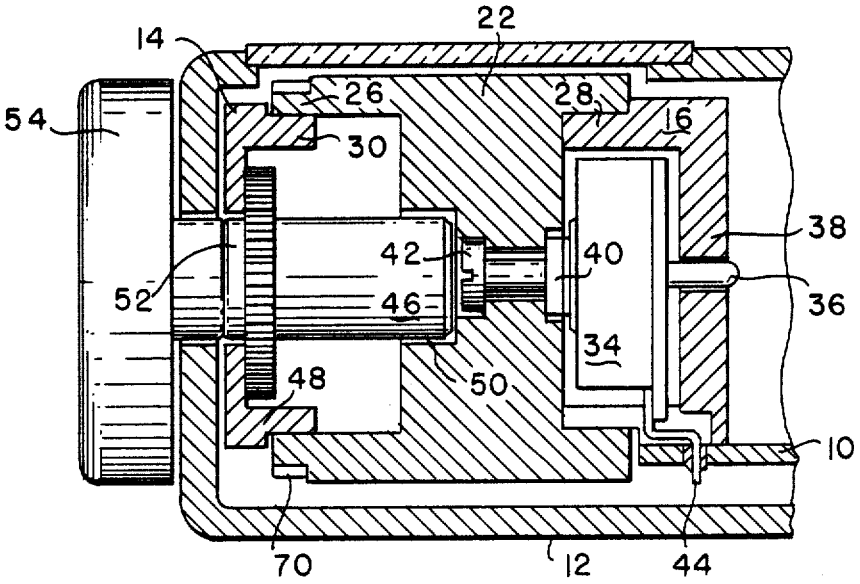
FIG. 4 is a sectional view taken along line 4—4 of FIG. 3.

Referring to FIGS. 3 to 5 a circuit board 10 is secured to a housing 12 of a television receiver at a lower portion therein. On the circuit board 10, a gear supporting plate 14 and a frame 16 are secured by screws 18, 20. The plate 14 and frame 16 are connected with each other by engagement of pins 13 and 15 projected from the frame 16 with holes 17 of the plate 14 and secured with each other by screws 19 with each other. A dial drum 22 has cylindrical portions 24 and 26 at both axial ends and is rotatably mounted on cylindrical supporting portions 28 and 30 of frame 16 and gear supporting plate 14 at the cylindrical portions 24 and 26. The dial drum 22 bears FIG. 32 for television channels and radio frequencies. A rheostat 34 is provided in a recess formed in the frame 16 adjacent the rear portion of the drum 22 and secured to the frame by engagement of two pins 36 projected from the rheostat 34 with holes 38 formed in the frame 16. A shaft 40 in sliding contact with the rheostat 34 is connected to the drum 22 by a screw 42. Terminals 44 of the rheostat 34 are connected to lead wires on the circuit board 10.

A shaft 46 of drive gear 48 is rotatably engaged with the drum 22 at a center hole 50 and another shaft 52 is rotatably supported in the supporting plate 14. The drive gear 48 is connected to a knob 54 by a screw 56. The gear 48 engages with a large diameter gear 60 integral with a small diameter gear, 62, shafts 64, 66 of which are rotatably supported in the supporting plate 12, and a bearing portion 68 formed on the frame 16. The gear 62 engages with an outer toothing 70 formed on the periphery of the drum 22 to form a gear reduction train.

When the knob 54 is rotated, the drive gear 48 secured to the knob 54 rotates together with the knob 54. The rotation of the gear 48 is transmitted to toothing 70 through gears 60 and 62 at a gear reduction ratio. Thus, the dial drum 22 is rotated at a low speed to rotate the sliding contact of the rheostat 34 to tune the rheostat to a desired television channel or radio frequency.

Since the rotation of the knob 54 is transmitted to the dial drum 22 through the gear reduction train in two steps, a large gear reduction ratio can be provided for fine tuning without increasing the diameter of the dial drum. Furthermore, the knob and the drum are in alignment with each other, which improves the operability and appearance of the tuning device.

While the invention has been described in conjunction with preferred specific embodiments thereof, it will be understood that this description is intended to illustrate and not limit the scope of the invention, which is defined by the following claims.

What is claimed is:

1. A tuning device comprising:

a frame;

a dial drum, rotatably supported in said frame, said dial drum having characters for tuning and having an outer toothing formed on the periphery thereof;

a rheostat operatively connected to said dial drum; *for being tuned upon rotation of said dial drum;* a knob having the rotational axis thereof in alignment with the rotational axis of said dial drum;

a drive gear co-axially secured to said knob and rotatably supported in said dial drum; and a gear reduction train disposed between said drive gear and said outer toothing for transmitting the rotation of the drive gear to said drum, said gear reduction train comprising:

a large diameter gear engaged with said drive gear[;], *and* a small diameter gear [engaged with said large diameter gear and disposed] in an integral relationship with said large diameter gear *and engaged with said outer toothing* whereby the axis of rotation of each gear is parallel to the axis of rotation of said knob.

2. A tuning device comprising:

a frame;

a dial drum, rotatably supported in said frame, said dial drum having characters for tuning and having an outer toothing formed on the periphery thereof;

a rheostat operatively connected to said dial drum;

a supporting plate;

a knob disposed external to said supporting plate such that the rotational axis thereof is in alignment with the rotational axis of said dial drum;

a drive gear co-axially secured to said knob and rotatably supported in said dial drum and said supporting plate;

a gear reduction train disposed between said drive gear and said outer toothing for transmitting the rotation of the drive gear to said dial drum.

3. A tuning device comprising:

a frame;

a dial drum, rotatably supported in said frame, said dial drum having characters for tuning and having an outer toothing formed on the periphery thereof;

a rheostat operatively connected to said dial drum *for being tuned upon rotation of said dial drum;* a supporting plate;

a knob disposed external to said supporting plate such that the rotational axis thereof is in alignment with the rotational axis of said dial drum;

a drive gear co-axially secured to said knob and rotatably supported in said dial drum and said supporting plate; and a gear reduction train disposed between said drive gear and said outer toothing for transmitting the rotation of the drive gear to said dial drum, said gear reduction train comprising:

a large diameter gear engaged with said drive gear[;], *and* a small diameter gear [engaged with said large diameter gear and] disposed in an integral relationship with said large diameter gear *and engaged with said outer toothing.*

* * * * *